United States Patent
Gibson

[11] 4,419,202
[45] Dec. 6, 1983

[54] METAL COATINGS

[75] Inventor: Ian P. Gibson, Snodland, England

[73] Assignee: The Secretary of State for Defence in Her Britannic Majesty's Government of the United Kingdom of Great Britain and Northern Ireland, London, England

[21] Appl. No.: 331,881

[22] Filed: Dec. 17, 1981

[30] Foreign Application Priority Data

Dec. 22, 1980 [GB] United Kingdom ............... 8041039

[51] Int. Cl.³ ............................................. C23C 15/00
[52] U.S. Cl. ............................... 204/192 N; 427/237; 427/238; 427/239; 204/192 C
[58] Field of Search ....................... 204/192 C, 192 N; 427/237–239

[56] References Cited

FOREIGN PATENT DOCUMENTS 2919191 11/1979 Fed. Rep. of Germany ... 204/192 C

OTHER PUBLICATIONS

J. M. Harris et al., "Studies of the Ti-W Metallization System on Si", *J. Electrochem. Soc.*, vol. 123, pp. 120-124 (1976).

J. E. Greene et al., "Adhesion of Sputter-Deposited Carbide Films to Steel Substrates", *Thin Solid Films*, vol. 37, pp. 373-385 (1976).

E. Eser et al., "Friction & Wear Results from WC+Co Coatings by -dc Biased RF Sputtering in a Helium Atmosphere", *J. Vac. Sci. Technol.* vol. 15, pp. 401-405 (1978).

T. Spalvins, "Survey of Ion Plating Sources", *J. Vac. Sci. Technol.*, vol. 17, pp. 315-321 (1980).

*Primary Examiner*—Aaron Weisstuch
*Attorney, Agent, or Firm*—Cushman, Darby & Cushman

[57] ABSTRACT

In the practice of the sputter ion plating of refractory metals or refractory metal compounds on substrates to form smooth dense substantially porous-free coatings a method whereby the substrate bias potential can be reduced, thereby reducing the generation of substrate heat, is provided wherein the source material consists of a refractory metal or a refractory metal compound and one or more further metals. The further metal may be another refractory metal. Typical refractory and further metals are tungsten and tantalum.

The source material may suitably be a bundle of wires consisting of wires of the refractory metal or metal compound and wires of the further metal.

For predetermined glow discharge conditions of source and substrate potentials and ionizable gas pressure, the source material preferably consists of the refractory metal or metal compound and the further metal in proportions to form a solid solution on the substrate.

The ionizable gas should be an inert gas of high atomic number. The inert gas may be mixed with a gas capable of reacting chemically with the refractory metal or the further metal, under the conditions of the glow discharge, thereby forming a coating of a compound on the substrate. For example, a hard refractory nitride may be formed using a reactive gas mixture of nitrogen in argon and tantalum and titanium as the refractory and further metals respectively.

8 Claims, 3 Drawing Figures

METAL COATINGS

This invention relates to a method for forming coherent wear-resistant coatings on the surface of substrates from refractory metals and refractory metal compounds.

There are a number of techniques for forming coatings on substrates including deposition of the coating material from the vapour phase. A recently developed vapour phase technique which has found favour in the deposition of coatings of refractory metals and alloys and electrically conducting compounds is known as sputter ion plating: the technique is usually operated with a simple DC glow discharge at a voltage dependent upon requirement, but typically of 1 KV, to transfer coating material by sputtering from source to substrate; sputtering readily generating the vapour of any of the refractory metals and their alloys. By contrast, in simple ion-plating, where vapour of the material to be deposited is generated by thermal evaporation from a crucible containing the material, problems are encountered in generating vapour of the refractory metals.

Sputter ion plating is a development of conventional sputtering wherein the source material is the principal cathode in an anode/cathode glow discharge system, the development being that of introducing the feature of substrate biassing characteristic of ion-plating to make the substrate a secondary cathode. In sputter ion plating with a negative potential of $-KV$ applied to the source material the negative bias applied to the substrate depends upon requirement but typically is $-100/-125$ V. Negative biassing of the substrate causes ion bombardment of the substrate surface, in addition to the relatively more powerful ion bombardment and sputtering of the principal cathode in the form of the source material: the substrate is surrounded by a space-charge region, termed the "Cathode fall", across which a substantial voltage can occur and ions which diffuse into the "cathode fall" are accelerated by the potential and bombard the substrate. Under conditions of simultaneous ion-bombardment and vapour deposition, well adhered and dense metallic coatings have been shown to be formed. Aside from this technical advance, the advent of substrate biassing in sputter ion plating has been shown to result in enhancement of the glow discharge, an increase in the source current, and a corresponding increase in the deposition rate with no diminution in coating quality: the increase in source current may require that the substrate bias potential be above a threshold value.

Various workers investigating the deposition of refractory metal coatings by sputter ion plating have however reported that substrate bias has a pronounced effect on the morphology of the coatings formed. It has been recognised that without bias refractory metals and the refractory carbides nitrides and oxides of these metals, and other high melting metals and alloys such as chromium and stainless steel, tend to form dendritic-type coatings in which dendrites grow in columnar fashion from substrate surfaces forming widespread interdendritic porosity. However, when sufficient bias power is applied, it has been observed that smooth dense substantially pore-free coatings have been formed. Such dense consolidated coatings are essential in applications where surface toughness and wear resistance are of paramount importance. The bias power requirement for a predetermined coating growth rate varies depending upon the material being deposited and principally on the refractoriness of that material. It is believed that the mechanism by which negative substrate biassing causes a dense pore-free coating to form depends on a redistribution of the condensing material caused by resputtering and induced by the ion-bombardment. The term "ion-polishing" has been coined to describe this physical mechanism which continuously prevents any excrescences from growing and causes the deposited material to form as a dense pore-free coating.

Although Direct Current sputtering as generally used in sputter ion plating is a relatively low-rate coating process encouraging the slow formation of dense pore-free coatings without requiring excessive bias and the concomitant development of substrate heat in the deposition of a range of materials, it has been found that power dissipation through overheating of substrates can seriously curtail allowable deposition rates. In the deposition of refractory materials requiring substantial bias potentials in attempts to produce dense pore-free coatings the problem of substrate heat and its build up can become a dominant factor particularly in view of the frequently prolonged treatment times: it will be apparent, for example, that the metallographic structure of a heat-treated steel substrate could be disturbed by prolonged exposure to elevated temperatures. In the sputter ion plating of gun barrels, for instance, temperatures up to 600° C. have been reported and it is believed that temperatures well in excess of this figure could be achieved in depositing the more refractory metals if the bias potential were to be sufficient to form dense pore-free coatings.

It has now been unexpectedly discovered that columnar growth in deposits during sputter ion plating of a refractory metal or a refractory metal compound can be reduced or substantially eliminated without the use of excessive substrate bias potentials, thereby incurring massive heating of the substrates, by co-deposition of that metal or compound with one or more further metals which further one or more metals may be refractory metals.

Accordingly, the invention resides in a method whereby the substrate bias potential can be reduced in the formation of a smooth dense substantially porous-free coating of a refractory metal or a refractory metal compound on a substrate by sputter ion plating wherein the source material consists of said refractory metal or metal compound and one or more further metals. Said further metal may be another refractory metal, and a combination of refractory metals is to be preferred when surface coatings are required to have the properties of wear and erosion resistance associated with refractory metals their alloys and compounds.

In this specification the term "refractory metal" means a metal having a melting point in excess of the melting point of iron (1535° C.) and includes the metals chromium, titanium, vanadium, rhodium, hafnium, ruthenium, niobium, iridium, molybdenum, osmium, tantalum, rhenium, tungsten, platinum, thorium, and zirconium; and the term "refractory metal compound" means a compound selected from the silicides, borides, nitrides, carbides and oxides of a "refractory metal" as defined above.

For deposition of a refractory metal onto the substrate the ionisable gas used should be one which does not react chemically with the substrate or the source material and should preferably be easily ionisable and have a high atomic number so as to form ions with a high momentum capable of ejecting metal atoms and ions from the source. A preferred gas is Argon, although other inert gases may be used. If a gas which is capable of reacting chemically with one or more of the metal constituents of the source under the conditions of the glow discharge is mixed with the inert gas, then compounds of the metal or metals may be formed in the discharge and deposited on the substrate: this process of compound formation at the substrate is known as "reactive sputtering". Columnar growth in the deposited coatings of these refractory metal compounds at nominal substrate bias potentials is avoided if such a reactive gas mixture is used in conjunction with a source consisting of a refractory metal and a further metal.

Advantages may be gained from reactive sputtering in that a coating containing for example extremely hard or refractory compounds may be obtained. Titanium nitride in a matrix of tantalum may be prepared, for example, by the use of a source consisting of titanium and tantalum, the gas mixture being one of argon and nitrogen; (titanium nitride is formed in preference to tantalum nitride).

A gas pressure of ca. 100 m Torr has been found to be suitable and this pressure may be maintained either statically or dynamically. A potential difference of between 200 and 2000 volts has been found to generate a suitable discharge in the ionisable gas in DC sputtering depending upon the geometry of the apparatus.

In one form of apparatus for carrying out the method of the invention, suitable for coating the inside surface of conducting tubes such as gun barrels, the source is in elongate form arranged along the axis of the tubular substrate. The source and tube may be contained within an enclosure containing a suitable gas or gas mixture, a primary discharge being generated between the source and ground and a secondary discharge generated between the tube and the ground, the source and the substrate being negatively biased relative to ground, or, alternatively, the enclosure may be dispensed with, the tube closed at both ends with airtight closures carrying appropriate electrical and gas inlet and exit connections, and a glow discharge established inside the tube itself. In this case the secondary negative bias potential is applied to the tube.

The use of an axial source has been found to be particularly advantageous in that it enables a uniform discharge to be sustained in tubes with a length substantially greater than their diameter.

Typically, if a potential of $-1000$ V is applied to the source, with a negative bias potential of $-125$ V applied to the tubular substrate, discharges may be maintained in tubes up to 60 cm long. In the case of tubes with complex internal geometries, such as rifled gun barrels, and those with small substrate—source distances, higher gas pressures may be needed than are normally used in sputter ion plating, but the exact pressure will depend upon the geometry of the apparatus and the metals involved, etc.

It has been found advantageous to use a source consisting of a bundle of fine wires of the metals to be deposited. As the component metals may have different sputtering rates, the use of such a source ensures that the composition of the surface of the source exposed to the ionic bombardment remains constant as the metals are removed as vapour. Another effect of differential sputtering rates of the metals of the source is that the composition of the deposited coating may not always correspond to the composition of the source. Variation in the composition of the deposited coating is therefore possible by altering the ratio of the metals in the source as appropriate. For many applications it has been found that the best coatings are formed by selecting deposition conditions which result in a coating which corresponds to a solid solution, for example one containing 10% by weight of tungsten in tantalum. The physical properties of any deposit formed during the coating process will of course have to be considered from the point of view of the application to which the coated substrate is to be put.

It is desirable to clean the surface of the substrate prior to the coating process by sputter cleaning. This may be achieved by generating a glow discharge in the gas with the substrate arranged as the main cathode. In this way the surface of the substrate is bombarded with ions of the gas, which effectively remove surface impurities. If tenacious impurities such as metal oxides are present on the surface it is preferable to clean the surface by sputter cleaning in a reactive atmosphere, for example by sputter cleaning in an atmosphere of argon plus 5% of hydrogen. Other reactive gas mixtures may be used, depending on the type of impurities which are present on the surface.

The geometry of the source and the relative positioning of the source and substrate to achieve optimum coating will depend on the shape and size of the substrate. At the gas pressures usually used in the method of the invention, gas scattering in the vapour phase is normally sufficient to enable metal atoms, etc, evaporated from the surface of the source to reach concavities and inturned areas of the substrate, and an unimpeded line of flight between the source and substrate is not normally necessary.

The practice of the invention has been found to produce tenacious, uniform, smooth coatings of refractory metals and refractory metal compounds on substrates of various shapes and sizes, at a convenient rate, without the generation of excessive substrate heat.

In the production of Ta: 10% wear-resistant coatings on the bores of gun barrels for example, smooth tenacious pore-free coatings have been formed with barrel temperatures in the range 200° to 600° C. and satisfactory coatings can be obtained with temperatures as low as 250° C. The treatment may be applied to gun barrels of all sizes but is of especial significance to large barrels up to 21 ft in length and having wall thicknesses upto 4 ins.

It has generally been found that in the deposition of W coatings, for example, bias potentials cannot be raised sufficiently to create the degree of ion polishing needed to produce dense pore-free coatings free of columnar development: moreover such bias potentials have generally produced quite unacceptable levels of substrate heat.

It has already been stated that the practice of sputter ion plating results in an increase in source current, provided the substrate bias potential exceeds a threshold value, with a corresponding increase in the deposition rate compared with conventional sputtering. Measurement of the source current during the coating process is found to give the best indication of the deposition rate, although the source current and deposition rates are not directly proportional, and caution is needed in raising the source current as too high a deposition rate may form powdery or loose coatings.

The invention will now be described by way of example only, with reference to the accompanying drawing and graphs in which, FIG. 1 shows a schematic layout of an apparatus suitable for coating the inside of a metal tube using the method of the invention.

Figure 1:
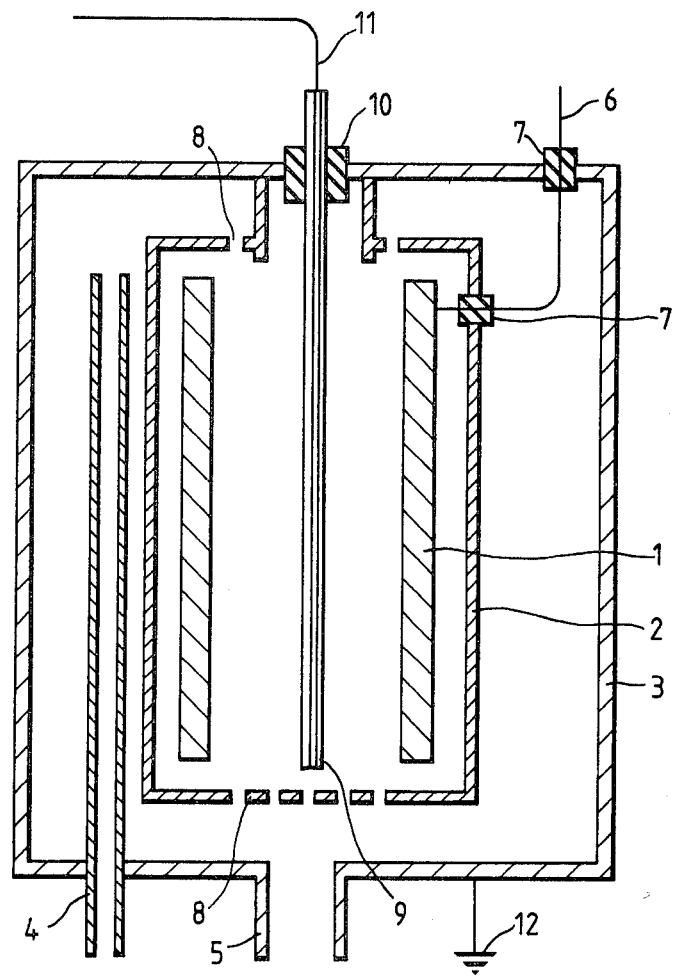

With reference to FIG. 1, a substrate comprises a hollow tube 1, the inner surface of which is to be coated with a tungsten/tantalum alloy. The tube 1 is mounted on an insulating support (not shown), inside a sheath 2. The tube 1 and sheath 2 are contained within an airtight metal walled enclosure 3 provided with an entrance port 4 and an exit port 5 connected to a vacuum pump (not shown). An electrical connector 6 enabling connection of the tube 1 to a DC electrical supply (not shown) passes through the sheath 2 and the wall of the enclosure 3 via the insulating plugs 7, that are in the wall of the enclosure 3 making an airtight seal therewith. Holes 8 are provided in the sheath 2 to allow access of gases introduced into the enclosure 3 via the entrance port 4 to the inside of the tube 1. A source 9 comprising a cylindrical bundle of tungsten and tantalum wires in a ratio of 9 tungsten wires to 1 tantalum wire passes axially along the tube 1 and through the wall of the enclosure 3 via the insulating airtight plug 10. An electrical connector 11 allows connection of the source 9 to a DC electrical supply (not shown). The enclosure 3 is connected to an electrical ground 12.

In use, the inner surface of the substrate 1 is first sputter cleaned. This may be carried out using either pure argon, or if tenacious surface impurities are present such as an oxide film, by using a reactive gas mixture, for example 90% argon plus 10% hydrogen. To sputter clean the surface, the enclosure 3 is first evacuated to a high vacuum using the vacuum pump, and is then repressurised to a dynamic pressure of 0.2 mbar with the cleaning gas. A glow discharge is then established between the tube 1 and the source 9, the tube 1 being the cathode, a negative potential of ca. 1000 V being applied via the connector 6. The inner surface of the tube 1 is thereby bombarded with ions of the gas or gases present, and surface impurities are removed. If a reactive gas mixture is used, the reactive sputter cleaning is followed by a period of sputter cleaning using pure argon.

The electrical connection to the tube 1 is then broken, a negative potential of $-1000$ V is applied to the source 9 and a secondary negative bias potential of $-125$ V is applied to the tube 1 via the connector 6, the enclosure 3 being pressurised with a dynamic pressure of ca. 0.2 mbar of pure argon. A glow discharge is thereby established inside the tube 1. Atoms, ions and atom-ion clusters of tungsten and tantalum are thereby ejected from the surface of the source, and are deposited on the inner surface of the tube 1, forming a tenacious and substantially non-columnar coating. When sufficient metal has been deposited on the tube 1, the discharge is stopped, air readmitted in the enclosure 3, and the coated tube 1 removed.

Although the method and apparatus above have been described with reference to the coating of the inner surface of tubes, it will be appreciated that by appropriate arrangements taking into account the shapes of source and substrate, substrates of other configurations may be used. Sources containing other ratios of tungsten and tantalum wires may also be used, for example 3:7, 5:5, and 7:3 Ta:W, to give tenacious non-columnar coatings of other compositions.

In all examples, in the practice of the invention, it has been found that substrate bias potentials of $-100$ V/$-125$ V have been quite effective in producing dense sound pore-free coatings. While substrate heat in the practice of the invention at these bias potentials develops to not insignificant levels it is generally not damaging to steel substrates, such as gun barrels, and effort is always made to keep the bias potential as low as possible consistent with achieving sound and dense non-columnar coatings. It is preferred to select metal combinations which are known to give the requisite wear-resistant coating but which also can form sound dense coatings with minimal values of bias potential.

Figure 2:
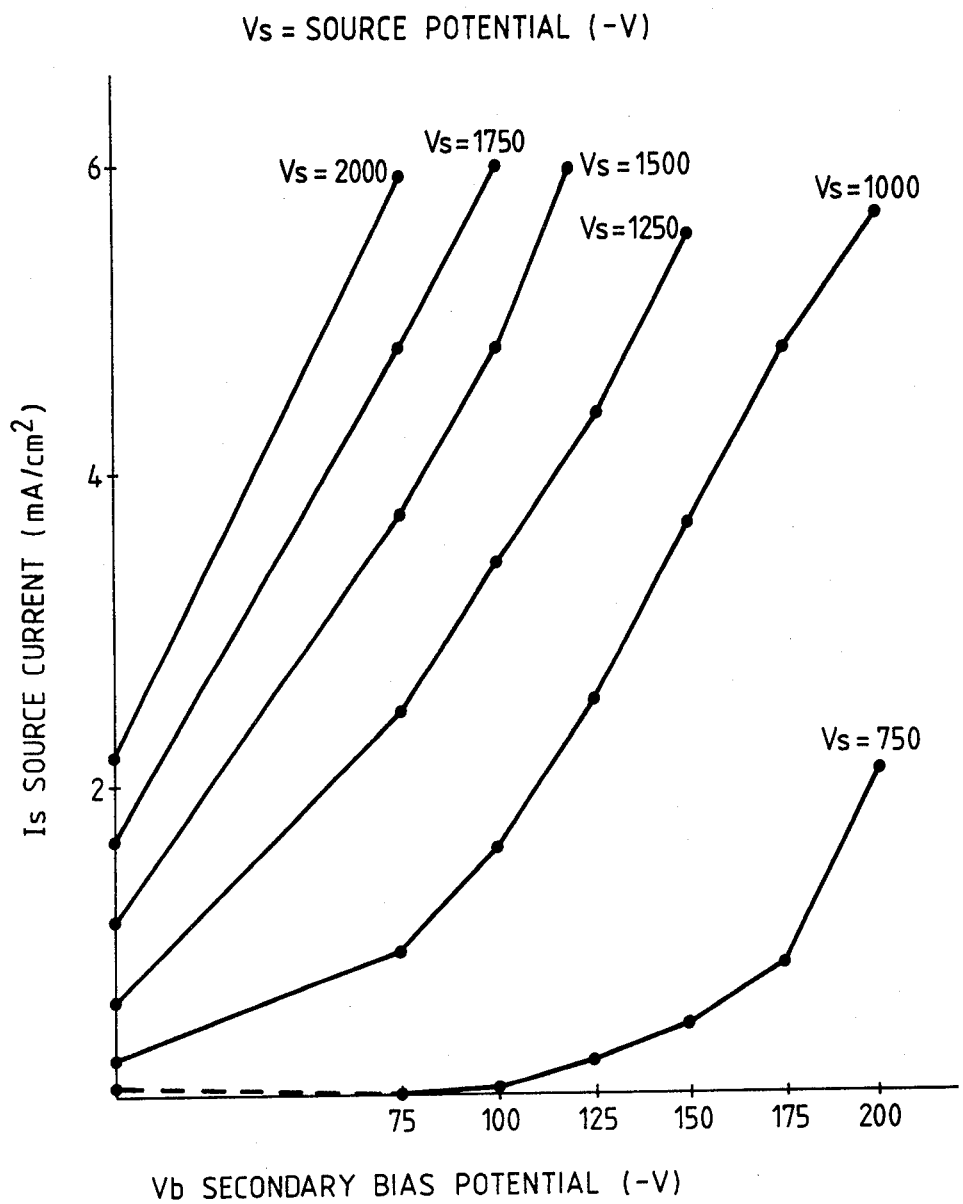
FIG. 2 shows the effect of various source potentials and secondary negative bias potentials on the source current using the apparatus of FIG. 1 with a tube 16 cm in length.
Figure 3:
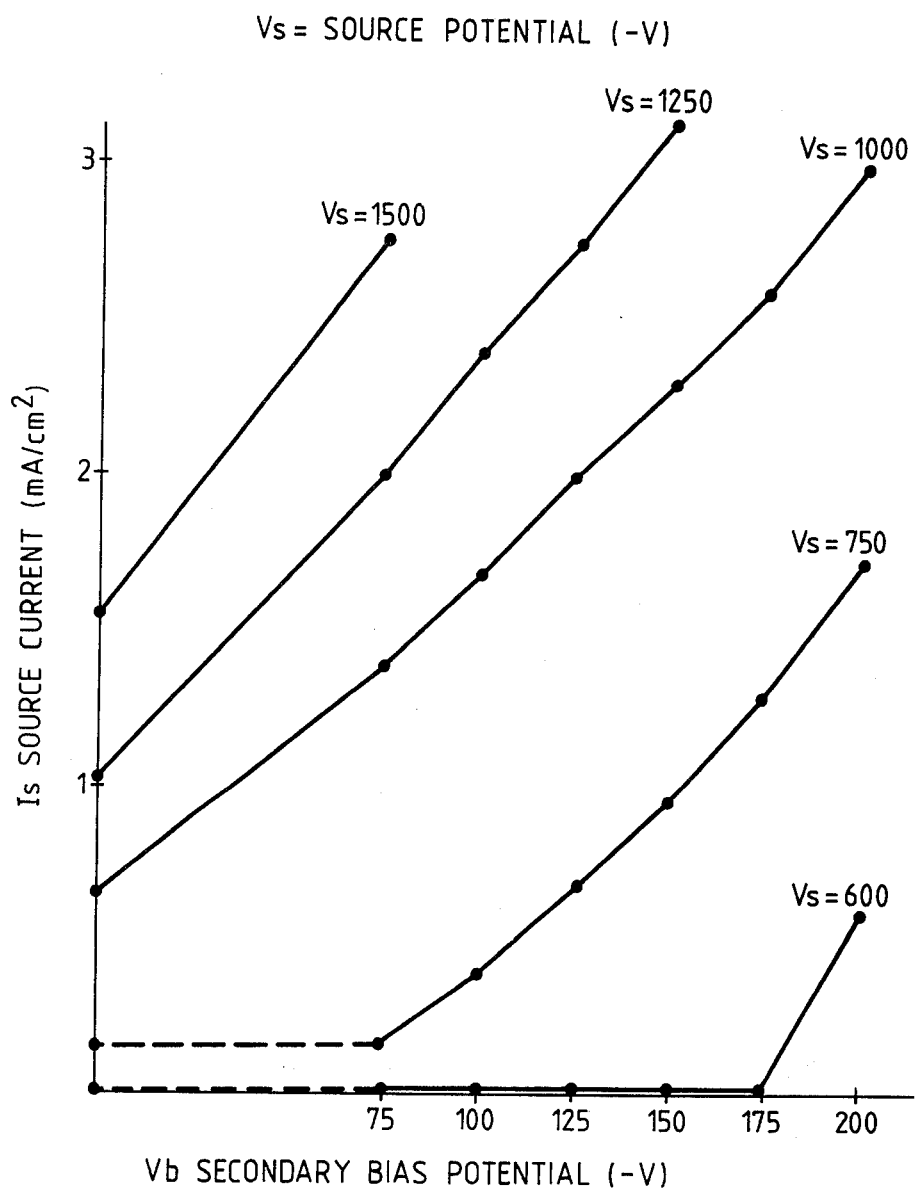
FIG. 3 shows the effect of various source potentials and secondary negative bias potentials on the source current using the apparatus of FIG. 1 with a tube 60 cm in length.

With reference to FIGS. 2 and 3, the source current is plotted against the secondary negative bias potential over a range of source potentials. A pressure of 0.2 mbar of pure argon was used to establish the glow discharge. The information in both graphs was derived from use of the apparatus of FIG. 1 using for FIG. 2 a tubular substrate and axial source 16 cm in length, and for FIG. 3 60 cm in length, in both cases 30 mm inside diameter. The enhancement of the source current by the secondary negative bias potential can be clearly seen, particularly in the case of relatively low source potentials of 600 and 750 volts applied to the 16 and 60 cm substrate respectively, when only extremely small source currents pass until the secondary negative bias potential is applied.

The effect of the secondary negative bias potential (Vb) upon the source current (Is), in mA, at various gas pressures (P) and source potentials (Vs) is expressed as the gain in source current in Tables 1 and 2 which show the effect in tubular steel substrates 16 cm and 60 cm long respectively, each being 30 mm inside diameter, the source comprising a cylindrical bundle of tungsten and tantalum wires in a ratio of 9 tungsten wires to 1 tantalum wire.

Other methods of generating a glow discharge in the gas will be apparent to those skilled in the art and may be used in the practice of the invention, for example an RF discharge, or DC biased RF. Methods involving RF are likely to be less satisfactory than a simple DC discharge, as RF methods normally require lower gas pressures and hence have a lower throwing power. In applications where there is a relatively large source—substrate distance, or where the gas discharge needs to be established over a large volume for example in the case of a large substrate, less throwing power is required and RF methods may be suitable.

TABLE I

16cm tube, 30mm inside diameter.

| | | | \multicolumn{13}{c}{$V_b$ (−V) →} |
| P (mbar) | Vs (V) | Is (mA) | 0 Is | 0 gain | 75 Is | 75 gain | 100 Is | 100 gain | 125 Is | 125 gain | 150 Is | 150 gain | 175 Is | 175 gain | 200 Is | 200 gain |
|---|---|---|---|---|---|---|---|---|---|---|---|---|---|---|---|---|
| 0.125 | 1000 | 0.2 | 0.2 | 1 | 0.2 | 1 | 0.2 | 1 | 0.2 | 1 | 0.2 | 1 | 0.2 | 1 | 0.2 | 1 |
| | 1250 | 0.3 | 0.3 | 1 | 0.3 | 1 | | | 44 | 147 | 76 | 253 | 108 | 360 | 125 | 417 |
| | 1500 | 0.35 | 0.35 | 1 | 54 | 154 | 79 | 226 | 109 | 311 | 140 | 400 | | | | |
| | 1750 | 0.4 | 62 | 155 | 83 | 208 | 117 | 293 | 134 | 335 | | | | | | |
| | 2000 | 0.5 | 82 | 164 | 117 | 234 | 131 | 262 | 150 | 300 | | | | | | |
| 0.15 | 1000 | 0.3 | 0.3 | 1 | 0.3 | 1 | 0.3 | 1 | 57 | 190 | 75 | 252 | 110 | 367 | | |
| | 1250 | 0.39 | 23.5 | 60 | 47.5 | 122 | 74 | 190 | 92 | 236 | 123 | 315 | 158 | 405 | | |
| | 1500 | 5.4 | 56 | 10.4 | 82 | 15.2 | 112 | 20.7 | 140 | 25.9 | | | | | | |
| | 1750 | 19 | 86 | 4.5 | 118 | 6.2 | 148 | 7.8 | | | | | | | | |
| | 2000 | 28 | 118 | 4.2 | 145 | 15.9 | | | | | | | | | | |
| 0.175 | 500 | 0.2 | 0.2 | 1 | 0.2 | 1 | 0.2 | 1 | 0.2 | 1 | 12.5 | 62 | 25 | 125 | | |
| | 600 | 0.2 | 0.2 | 1 | 0.2 | 1 | 0.2 | 1 | 18 | 90 | 38 | 190 | 55 | 275 | | |
| | 750 | 0.2 | 0.2 | 1 | 8.2 | 41 | 22.5 | 112 | 36 | 180 | 62 | 310 | 88 | 440 | | |
| | 1000 | 0.2 | 22 | 110 | 41 | 205 | 59 | 295 | 85.5 | 427 | 120 | 600 | 140 | 700 | | |
| | 1250 | 7.3 | 52 | 7.1 | 69.2 | 9.5 | 99 | 13.6 | 130 | 17.8 | 162 | 22.2 | | | | |
| | 1500 | 18.0 | 81.8 | 4.5 | 110 | 6.1 | 140 | 7.8 | 175 | 9.7 | | | | | | |
| | 1750 | 30.0 | 114 | 3.8 | 142 | 4.7 | | | | | | | | | | |
| | 2000 | 46.0 | 142 | 3.1 | | | | | | | | | | | | |
| 0.2 | 750 | 0.13 | 0.3 | 2 | 1.4 | 11 | 6.4 | 49 | 12 | 92 | 21.4 | 165 | 53 | 408 | | |
| | 1000 | 6.6 | 23.6 | 4 | 40 | 6 | 63 | 9.5 | 92 | 14 | 120 | 18 | 142 | 21.5 | | |
| | 1250 | 15 | 62 | 4.1 | 86 | 5.7 | 110 | 7.3 | 138 | 9.2 | | | | | | |
| | 1500 | 28 | 94 | 3.4 | 120 | 4.3 | 149 | 5.3 | | | | | | | | |
| | 1750 | 55 | 148 | 2.7 | | | | | | | | | | | | |
| 0.25 | 750 | 1.3 | 1.3 | 1 | 3.65 | 2.8 | 8.7 | 6.7 | 26.8 | 20.6 | 40.5 | 31.2 | 48.5 | 37.3 | | |
| | 1000 | 8.5 | 29 | 3.4 | 48.6 | 5.7 | 69 | 8.1 | 94 | 11.1 | 126 | 14.8 | 150 | 7.6 | | |
| | 1250 | 23 | 72 | 3.1 | 97.5 | 4.2 | 123 | 5.3 | 152 | 6.6 | 17.6 | 7.7 | | | | |
| | 1500 | 44 | 112 | 2.5 | | | | | | | | | | | | |
| 0.3 | 600 | 2.6 | 2.6 | 1 | 2.9 | 1.1 | 3.0 | 1.5 | 5.6 | 2.2 | 9.0 | 3.5 | 18.0 | 6.9 | | |
| | 750 | 6.3 | 9.7 | 1.5 | 14.2 | 2.25 | 22 | 3.5 | 50 | 7.9 | 93 | 14.8 | 150 | 23.8 | | |
| | 1000 | 35 | 108 | 3.1 | 132 | 3.8 | | | | | | | | | | |
| 0.4 | 600 | 20 | 22.5 | 1.1 | 29.5 | 1.1 | 38.5 | 1.9 | 70 | 3.5 | 112 | 5.6 | 150 | 7.5 | | |
| | 750 | 51 | 77 | 1.5 | 120 | 2.4 | 160 | 3.1 | | | | | | | | |

TABLE 2

60cm tube 30mm inside diameter.

| | | | \multicolumn{13}{c}{$V_b$ (−V) →} |
| P (mbar) | Vs (V) | Is (mA) | 0 Is | 0 gain | 75 Is | 75 gain | 100 Is | 100 gain | 125 Is | 125 gain | 150 Is | 150 gain | 175 Is | 175 gain | 200 Is | 200 gain |
|---|---|---|---|---|---|---|---|---|---|---|---|---|---|---|---|---|
| 0.125 | 1250 | 0.35 | 0.35 | 1 | 0.35 | 1 | 0.35 | 1 | 0.35 | 1 | 150 | 428 | 170 | 486 | | |
| | 1500 | 0.45 | 0.45 | 1 | 0.48 | 1.1 | 180 | 400 | 230 | 511 | 250 | 555 | 265 | 589 | | |
| | 1750 | 0.55 | 0.55 | 1 | 80 | 145 | 240 | 436 | 285 | 518 | | | | | | |
| | 2000 | 0.65 | 0.65 | 1 | 260 | 400 | | | | | | | | | | |
| 0.15 | 1000 | 0.35 | 0.35 | 1 | 0.35 | 1 | 0.35 | 1 | 0.35 | 1 | 98 | 280 | 135 | 386 | | |
| | 1250 | 0.35 | 0.35 | 1 | 0.35 | 1 | 100 | 286 | 160 | 457 | 195 | 557 | 225 | 643 | | |
| | 1500 | 0.55 | 63 | 114 | 180 | 327 | 245 | 445 | 280 | 509 | | | | | | |
| | 1750 | 6.5 | 200 | 30.7 | 270 | 415 | | | | | | | | | | |
| | 2000 | 78 | 275 | 3.5 | | | | | | | | | | | | |
| 0.175 | 750 | 0.25 | 0.25 | 1 | 0.25 | 1 | 0.25 | 1 | 0.25 | 1 | 70 | 280 | 88 | 352 | | |
| | 1000 | 26 | 33 | 1.3 | 80 | 3.1 | 130 | 5 | 170 | 6.5 | 200 | 7.7 | 235 | 9.0 | | |
| | 1250 | 63.5 | 150 | 2.4 | 200 | 3.1 | 240 | 3.8 | 270 | 4.3 | | | | | | |
| | 1500 | 110 | 230 | 2.1 | 285 | 2.6 | | | | | | | | | | |
| | 1750 | 150 | 295 | 2.0 | | | | | | | | | | | | |
| | 2000 | 195 | | | | | | | | | | | | | | |
| 0.2 | 600 | 3.75 | 1.5 | 0.5 | 1.5 | 0.5 | 1.5 | 0.5 | 1.5 | 0.5 | 1.5 | 0.5 | 54 | 14.5 | | |
| | 750 | 16 | 17.5 | 1.1 | 42 | 2.6 | 71 | 4.4 | 96 | 6 | 130 | 8.1 | 173 | 10.3 | | |
| | 1000 | 65 | 140 | 2.2 | 180 | 2.8 | 200 | 3.1 | 230 | 3.5 | 260 | 4 | 300 | 4.6 | | |
| | 1250 | 103 | 200 | 1.9 | 240 | 2.3 | 275 | 2.7 | 312 | 3.0 | | | | | | |
| | 1500 | 155 | 275 | 1.8 | | | | | | | | | | | | |
| 0.25 | 500 | 3.2 | 1.2 | 0.4 | 1.2 | 0.4 | 1.2 | 0.4 | 1.2 | 0.4 | 5 | 1.6 | 26 | 8.1 | | |
| | 600 | 12.0 | 6.0 | 0.5 | 6.5 | 0.6 | 19.0 | 1.6 | 42.5 | 3.5 | 74 | 6.2 | 120 | 10 | | |
| | 750 | 40.5 | 45 | 1.1 | 68 | 1.7 | 105 | 2.6 | 138 | 3.4 | 182 | 4.5 | 230 | 5.7 | | |
| | 1000 | 120 | 180 | 1.5 | 218 | 1.8 | 200 | 2.1 | 280 | 2.3 | 315 | 2.6 | | | | |
| | 1250 | 182 | 280 | 1.5 | 312 | 1.7 | | | | | | | | | | |
| 0.3 | 500 | 9.2 | 10.5 | 1.1 | 10.5 | 1.1 | 10.5 | 1.1 | 14.6 | 1.6 | 38 | 4.1 | 60 | 6.5 | | |
| | 600 | 37 | 30 | 0.8 | 42 | 1.1 | 66 | 1.8 | 93 | 2.5 | 155 | 4.2 | 215 | 5.8 | | |
| | 750 | 85.5 | 110 | 1.3 | 133 | 1.6 | 170 | 2.0 | 225 | 2.6 | 278 | 3.3 | | | | |
| | 1000 | 198 | 280 | 1.4 | | | | | | | | | | | | |
| 0.4 | 500 | 58 | 73 | 1.3 | 90 | 1.6 | 112 | 1.9 | 128 | 2.2 | 140 | 2.4 | 215 | 3.7 | | |
| | 600 | 135 | 168 | 1.2 | 185 | 1.4 | 215 | 1.6 | 280 | 2.1 | | | | | | |
| | 750 | 245 | 320 | 1.3 | | | | | | | | | | | | |

I claim:

1. A method of coating the inner surface of a gun barrel with a wear resistant material, comprising the steps of:

(i) providing a coating material source within the gun barrel comprising a refractory metal or a refractory metal compound together with another metal, said refractory metal having a melting point in excess of 1535° C.;

(ii) establishing a glow discharge in the region of the source, said source being connected as a sputtering cathode; and (iii) applying a negative bias potential to the gun barrel;

whereby a smooth tenacious coating having a substantially non-columnar microstructure is formed on the inner surface of the gun barrel without excessive heating thereof.

2. A method according to claim 4 wherein the said refractory metal is selected from the group comprising chromium, titanium, vanadium, rhodium, hafnium, ruthenium, niobium, iridium, molybdenum, osmium, tantalum, rhenium, tungsten, platinum, thorium, and zirconium.

3. A method according to claim 1 wherein the source includes a refractory metal compound selected from the silicides, borides, nitrides, carbides and oxides of a metal selected from the group comprising chromium, titanium, vanadium, rhodium, hafnium, ruthenium, niobium, iridium, molybdenum, osmium, tantalum, rhenium, tungsten, platinum, thorium, and zirconium.

4. A method according to claim 1 wherein the said other metal is selected from the group comprising chromium, titanium, vanadium, rhodium, hafnium, ruthenium, riobium, iridium, molybdenum, osmium, tantalum, rhenium, tungsten, platinum, thorium, and zirconium.

5. A method according to claim 1 wherein the source comprises a bundle consisting of wires of said refractory metal or refractory metal compound, and wires of the said another metal.

6. A method according to claim 1 wherein the source comprises tungsten and tantalum.

7. A method according to claim 1, wherein the said bias potential is in the range $-100$ V to $-125$ V.

8. A method according to claim 1 wherein the said glow discharge is established by means of a negative DC potential applied to the source.

* * * * *